US010725433B2

(12) United States Patent
Fujimoto

(10) Patent No.: US 10,725,433 B2
(45) Date of Patent: Jul. 28, 2020

(54) TIME-TO-DIGITAL CONVERSION CIRCUITRY

(71) Applicant: SHARP KABUSHIKI KAISHA, Sakai, Osaka (JP)

(72) Inventor: Yoshihisa Fujimoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/700,547

(22) Filed: Dec. 2, 2019

(65) Prior Publication Data

US 2020/0174427 A1 Jun. 4, 2020

Related U.S. Application Data

(60) Provisional application No. 62/775,096, filed on Dec. 4, 2018.

(51) Int. Cl.
  *G04F 10/00* (2006.01)
  *H03L 7/085* (2006.01)
  *H03M 1/00* (2006.01)

(52) U.S. Cl.
  CPC ............ *G04F 10/005* (2013.01); *H03L 7/085* (2013.01); *H03M 1/002* (2013.01); *H03L 2207/50* (2013.01)

(58) Field of Classification Search
  CPC ...... G04F 10/005; H03M 1/002; H03L 7/085; H03L 2207/50
  USPC ........................................ 341/155, 144, 166
  See application file for complete search history.

(56) References Cited

U.S. PATENT DOCUMENTS

| 10,503,122 | B2 * | 12/2019 | Testi | .................. G04F 10/06 |
| 10,579,021 | B2 * | 3/2020 | Salle | .................. H03L 7/0991 |
| 10,623,010 | B2 * | 4/2020 | Loke | .................. H03L 7/0996 |

OTHER PUBLICATIONS

Singo Mandai,"Multichannel Digital Silicon Photomultipliers for Time-of-Flight PET", Master of Science, Univ. of Tokyo, 2014, pp. 92-94.
Cristiano Niclass et.al.,"A 100-m Range 10-Frame/s 340 96-Pixel Time-of-Flight Depth Sensor in 0.18-μm CMOS", IEEE Journal of Solid-State Circuits vol. 48, No. 2, Feb. 2013, pp. 559-572.
Bojan Markovic et.al.,"A High-Linearity,17 ps Precision Time-to-Digital Converter Based on a Single-Stage Vernier Delay Loop Fine Interpolation", IEEE Trans. Circuits and Systems I, vol. 60, No. 3, Mar. 2013.

* cited by examiner

*Primary Examiner* — Brian K Young
(74) *Attorney, Agent, or Firm* — ScienBiziP, P.C.

(57) ABSTRACT

Time-to-digital conversion circuitry converts a time between a start time point and a stop time point, which are state-change time points of digital signals, into digital. The time-to-digital conversion circuitry comprises oscillation circuitry that outputs a plurality of phase signals having different phases, and outputs a digital value of the time based on the plurality of phase signals. The oscillation circuitry performs free-running oscillation and outputs the phase signals that do not synchronize with the start time point and the stop time point.

5 Claims, 7 Drawing Sheets

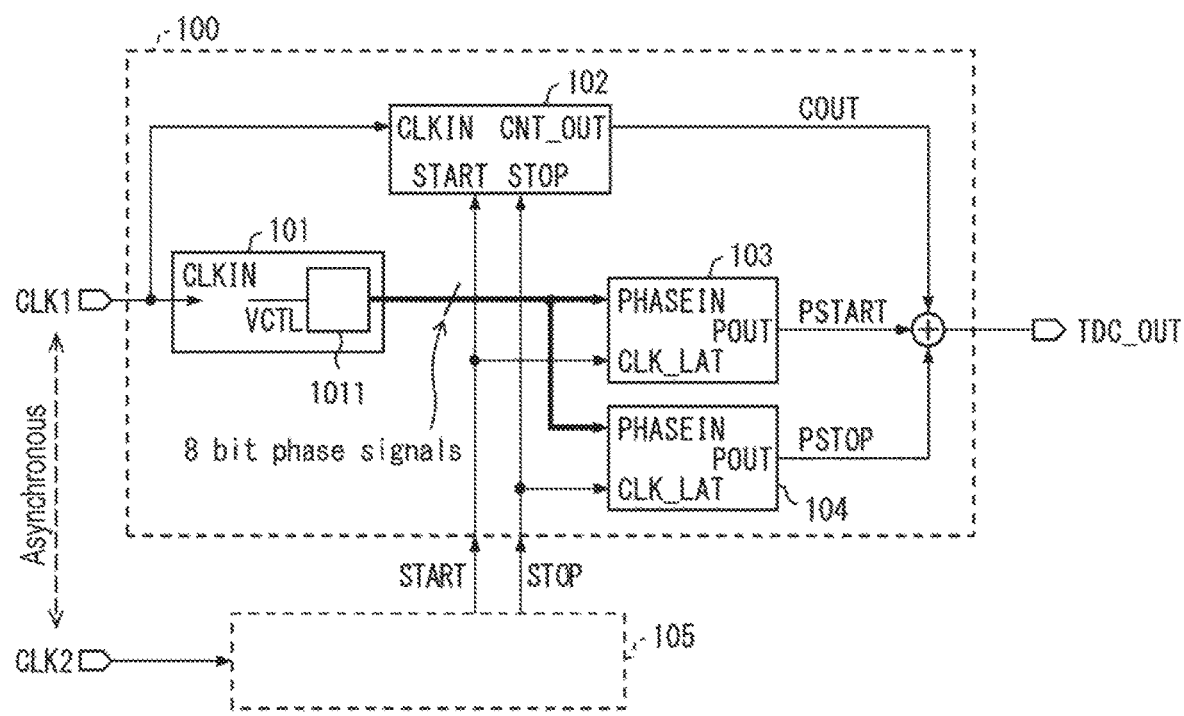
FIG. 1
(Conventional)

FIG. 2
(Conventional)
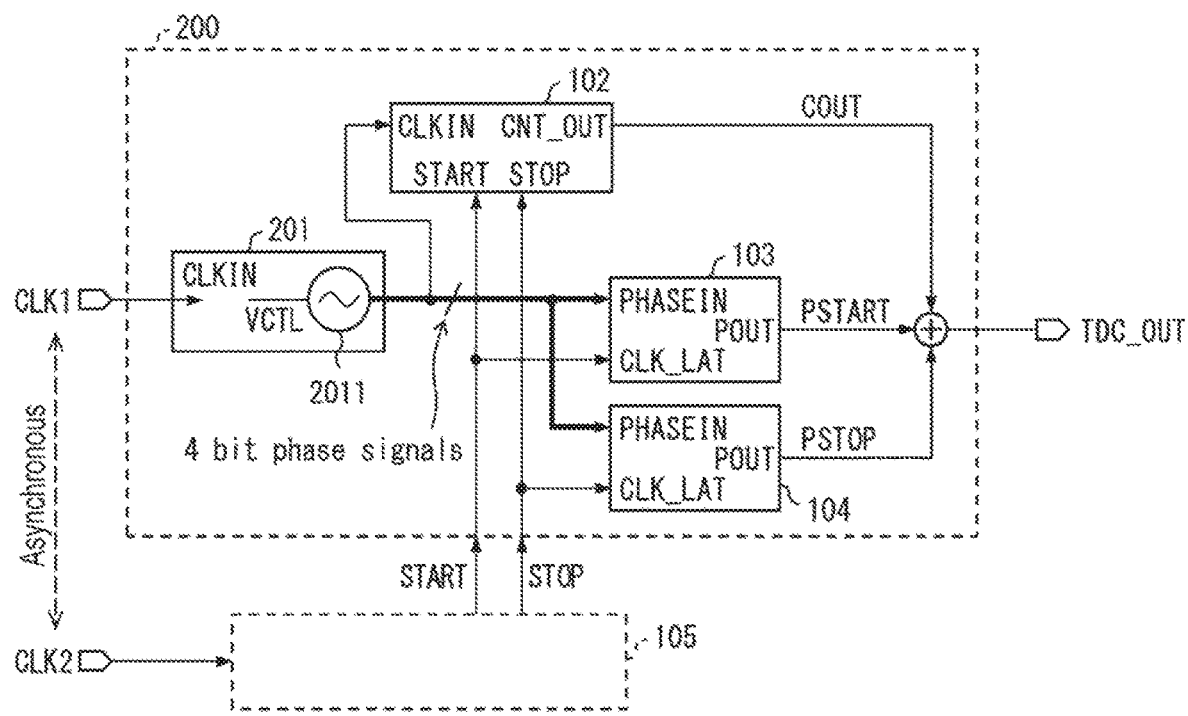

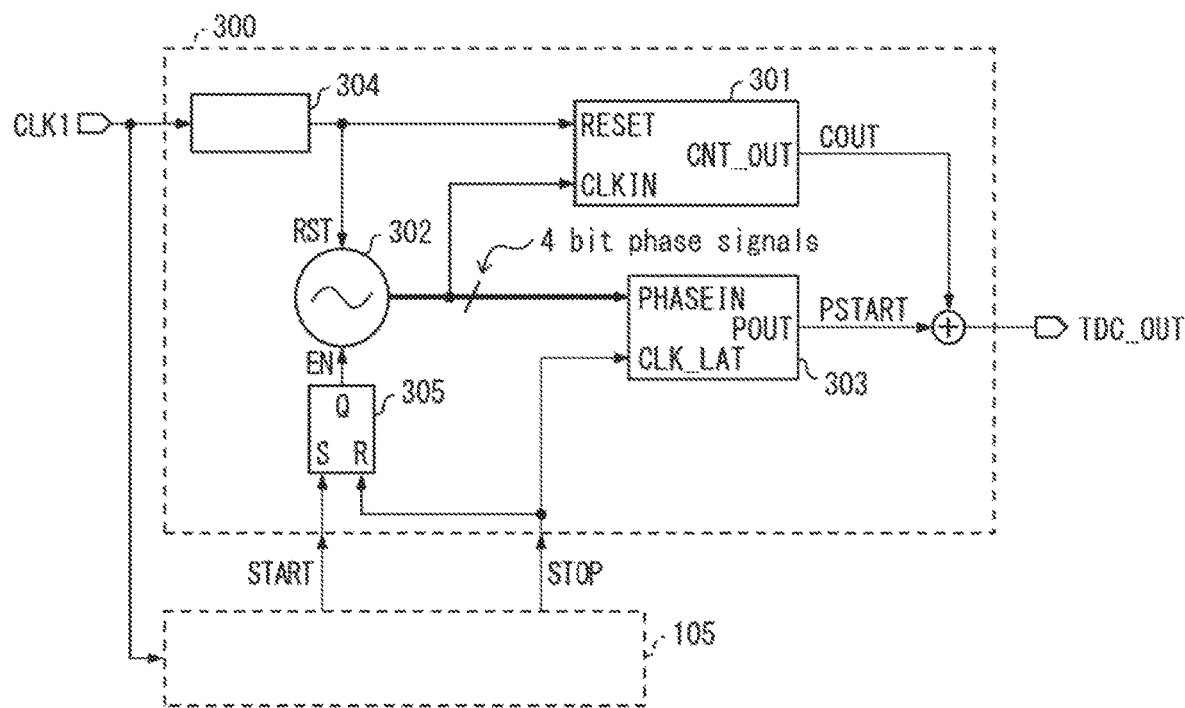
FIG. 3
(Conventional)

TIME-TO-DIGITAL CONVERSION CIRCUITRY

TECHNICAL FIELD

The present invention relates to time-to-digital conversion circuitry having high linearity.

BACKGROUND ART

Time-to-digital conversion circuitry is circuitry for measuring an amount of time delay between two or more digital signals, a time difference between two different edges of one digital signal, and so on by using digital values. The time-to-digital conversion circuitry is utilized in various fields of science and technology, such as the fields of communication, the fields of nuclear power, and the fields of electronic circuitry. Specifically, the time-to-digital conversion circuitry is used incorporated into LiDAR, which is an optical system for measuring the time of flight of a photon that is very weak light, phase-locked loops, which are integrated circuitry, analog-to-digital converting circuitry, and so on.

NPL 1 discloses time-to-digital conversion circuitry having high linearity. The configuration of this time-to-digital conversion circuitry is illustrated in FIG. 1.

As illustrated in FIG. 1, a TDC (Time-to-Digital Converter) 100 comprises a DLL (Delay-Locked Loop) 101, a ripple counter 102, and phase sampling circuitry 103, 104.

A clock CLK1 is input to the DLL 101 and the ripple counter 102. The DLL 101 includes a VCDL (Voltage Controlled Delay Line) 1011. The phase sampling circuitry 103 samples a plurality of phase signals from the VCDL 1011 in synchronization with a start signal START output from a system 105 to be observed. The phase sampling circuitry 104 samples the plurality of phase signals from the VCDL 1011 in synchronization with a stop signal STOP output from the system 105.

The ripple counter 102 starts counting edges of the clock CLK1 in synchronization with the start signal START and stops the counting in synchronization with the stop signal STOP.

The ripple counter 102, the phase sampling circuitry 103, and the phase sampling circuitry 104 output a digital count value COUT, a sampled value PSTART, and a sampled value PSTOP, respectively. An amount-of-delay measurement value TDC_OUT between the start signal START and the stop signal STOP is calculated according to equation (1) below, based on the count value COUT, the sampled value PSTART, and the sampled value PSTOP.

$$TDC\_OUT = COUT \cdot 8 + (PSTOP - PSTART) \quad (1)$$

where one cycle of the phase signals output from the VCDL 1011 is assumed to be equal to one cycle of the clock CLK1. Also, 8-bit phase signals input to the phase sampling circuitry 103, 104 are assumed to be signals obtained by delaying one cycle of the clock CLK1 into eight different phases.

Meanwhile, a Sliding Scale Technique is stated in NPL 1 as a method for improving linearity of an AD conversion circuitry. In this method, a random signal is added to an input signal of the AD conversion circuitry, the signal is subjected to AD conversion, and an amount corresponding to the random signal is subtracted from the result of the AD conversion. This operation can alleviate nonlinearity of the AD conversion circuitry. Use of a Cyclic Sliding Scale Technique (CSST) in which this idea is applied to a TDC can improve the linearity of the TDC with a simple configuration.

Now, a method for realizing the CSST will be briefly described.

Since the clock CLK1 for the TDC 100 is generally generated from crystal oscillator circuitry, the cycle of the clock CLK1 is accurate, and the count value COUT is also accurate, that is, the linearity of the count value COUT is high. Meanwhile, since delay characteristics of delay elements that constitute the VCDL 1011 vary, the 8-bit phase signals cannot equally divide one cycle of the clock CLK1. Variations in the delay characteristics influence phase-signal sampling performed by phase sampling circuitry 103, 104 and consequently become a major factor that causes nonlinearity in an output of the TDC 100, that is, the amount-of-delay measurement value TDC_OUT.

The TDC 100 uses the CSST to alleviate the influences of the nonlinearity. Thus, in the TDC 100, the phase sampling circuitry 103 is provided for the start signal START, and the phase sampling circuitry 104 is also provided for the stop signal STOP. Also, the TDC 100 makes the 8-bit phase signals of the VCDL 1011 asynchronous with the start signal START and the stop signal STOP. This can improve the linearity of the TDC 100. In order to realize the above-described asynchronization, the system 105 is operated with a clock CLK2, which is asynchronous with the clock CLK1.

Unlike the TDC 100 in FIG. 1, a TDC (FIG. 8(a) and FIG. 8(b)) disclosed in NPL 2 uses a PLL (Phase-Locked Loop) and a VCO (Voltage Controlled Oscillator) instead of a DLL and a VCDL, respectively. The configuration of this TDC is illustrated in FIG. 2.

A TDC 200 illustrated in FIG. 2 comprises a ripple counter 102, phase sampling circuitry 103, 104, and a PLL 201.

The PLL 201 includes a VCO 2011. The phase sampling circuitry 103 samples a plurality of phase signals from the VCO 2011 in synchronization with a start signal START from a system 105. The phase sampling circuitry 104 samples the plurality of phase signals from the VCO 2011 in synchronization with a stop signal STOP from the system 105.

The ripple counter 102 starts counting, as an input clock, a particular phase signal output from the VCO 2011, in synchronization with the start signal START, and stops the counting in synchronization with the stop signal STOP.

The ripple counter 102, the phase sampling circuitry 103, and the phase sampling circuitry 104 output a digital count value COUT, a sampled value PSTART, and a sampled value PSTOP, respectively. An amount-of-delay measurement value TDC_OUT between the start signal START and the stop signal STOP is calculated according to equation (1) noted above, based on the count value COUT, the sampled value PSTART, and the sampled value PSTOP.

In this case, it is assumed that 4-bit phase signals input to the phase sampling circuitry 103, 104 are signals obtained by dividing one cycle of phase signals output from the VCO 2011 into eight, phases.

Thus, the TDC 200 illustrated in FIG. 2 also has a configuration to which CSST is applied, as in the TDC 100 in FIG. 1. Accordingly, it is possible to improve nonlinearity of the TDC 200 which is caused by variations in the delay characteristics of delay elements that constitute the VCO 2011.

In a TDC (FIG. 5.26 and FIG. 5.27) disclosed in NPL 3 a PLL 201 is not included, and oscillation operation of a VCO is turned ON/OFF in accordance with a start signal START and a stop signal STOP, unlike the TDC 200 in FIG. 2. The configuration of this TDC is illustrated in FIG. 3.

As illustrated in FIG. 3, a TDC 300 comprises a ripple counter 301, a VCO 302, phase sampling circuitry 303, reset circuitry 304 (in the figure, RSTGEN), and an SR latch 305.

The VCO 302 has a reset terminal RST and an enable terminal EN. A reset signal supplied from the reset circuitry 304 in order to set an internal state of the VCO 302 to a reset state is input to the reset terminal RST. An enable signal for controlling ON/OFF of the oscillation operation is input to the enable terminal EN.

The ripple counter 301 counts, as an input clock, a particular phase signal output from the VCO 302. The phase sampling circuitry 303 samples 4-bit phase signals of the VCO 302 in synchronization with the stop signal STOP.

The reset circuitry 304 resets the ripple counter 301 and the VCO 302 before time measurement upon the start signal START. The SR latch 305 controls ON/OFF of the VCO 302.

In this case, the VCO 302 performs oscillation when the potential level of the enable terminal EN is high and stops the oscillation when the logic level of the enable terminal EN is low. Also, an output signal of the SR latch 305 goes high in synchronization with the start signal START and goes low in synchronization with the stop signal STOP. A system 105 operates with a clock CLK1, as in the TDC 300.

In a typical system, a start signal START or a stop signal STOP is synchronous with an operation clock of a TDC. Thus, the TDC 300 illustrated in FIG. 3 uses the clock CLK1 that is common to the system 105.

In this case, since the TDC 300 does not comprise a PLL, the VCO 302 oscillates in a free-running manner. Accordingly, the oscillation frequency of the VCO 302 is uncorrelated with the frequency of the clock CLK1. Also, after the VCO 302 is reset to a certain predetermined state in response to a reset signal from the reset circuitry 304 before time measurement upon the start signal START, the VCO 302 starts oscillation in synchronization with the start signal START and stops the oscillation in synchronization with the stop signal STOP. That is, immediately before the VCO 302 starts oscillation in synchronization with the start signal START, the phase signals of the VCO 302 are always fixed to the aforementioned reset state.

Accordingly, the 4-bit phase signals output from the VCO 302 and the start signal START are thought to be synchronous with each other. Thus, the TDC 300 cannot use CSST, making it difficult to enhance the linearity.

CITATION LIST

Non Patent Literature

[NPL 1] Bojan Markovic et. al., "A High-Linearity, 17 ps Precision Time-to-Digital Converter Based on a Single-Stage Vernier Delay Loop Fine Interpolation", IEEE Trans. Circuits and Systems I, 2013

[NPL 2] Cristiano Niclass et. al., "A 100-m Range 10-Frame/s 340 96-Pixel Time-of-Flight Depth Sensor in 0.18-μm CMOS", IEEE Journal of Solid-State Circuits 2013, pp 559-572

[NPL 3] Singo Mandai, "Multichannel Digital Silicon Photomultipliers for Time-of-Flight PET", Master of Science, Univ. of Tokyo, 2014, pp 92-94

SUMMARY OF INVENTION

Technical Problem

In the TDC 100 illustrated in FIG. 1 and the TDC 200 illustrated in FIG. 2, the clocks CLK1, which are respective operation clocks, need to be asynchronous with the start signal START and the stop signal STOP input from the system 105. Thus, it is necessary to construct a clock system in which the clock CLK1 of the TDC 200 and the clock CLK2 of the system 105 are independent from each other.

The TDC 300 illustrated in FIG. 3 can be operated with the clock CLK1, which is the same operation clock as in the system 105. However, the phase of the start signal START and the phases of the phase signals output from the VCO 302 synchronize with each other. Thus, it is difficult to enhance the linearity of the TDC 300.

One aspect of the present disclosure is intended to suppress delay linearity deterioration due to variations in the delay characteristics of delay elements that constitute oscillation circuitry.

Solution to Problem (1) One embodiment of the present invention is time-to-digital conversion circuitry that converts a time between a start time point and a stop time point, which are state-change time points of digital signals, into digital. The time-to-digital conversion circuitry comprises; oscillation circuitry that outputs a plurality of phase signals having different phases; first phase sampling circuitry that outputs a first phase value determined by the plurality of phase signals sampled in synchronization with the start time point; second phase sampling circuitry that outputs a second phase value determined by the plurality of phase signals sampled in synchronization with the stop time point; a counter that counts the number of pulses of any one of the plurality of phase signals; and output circuitry that adds a difference between the second phase value and the first phase value to a value obtained by multiplying a count value of the counter by a constant value. The oscillation circuitry performs free-running oscillation and outputs the phase signals that do not synchronize with the start time point and the stop time point.

(2) Also, in addition to the configuration in (1) described above, one embodiment of the present invention is time-to-digital conversion circuitry in which the oscillation circuitry constantly oscillates.

(3) Also, in addition to the configuration in (1) or (2) described above, one embodiment of the present invention is time-to-digital conversion circuitry further comprises: a phase synchronization loop including external oscillation circuitry having a configuration that is the same as or similar to the oscillation circuitry. A voltage or electrical current for controlling an oscillation frequency or a phase of the external oscillation circuitry is also applied to the oscillation circuitry, and an oscillation frequency of the oscillation circuitry is controlled to have a value close to the oscillation frequency of the external oscillation circuitry.

(4) Also, in addition to the configuration in (1), (2), or (3) described above, one embodiment of the present invention is time-to-digital conversion circuitry in which the digital signals include a start signal whose rising edge or falling edge is a start time point and a stop signal whose falling edge or rising edge is a stop time point.

(5) In addition to the configuration in (1), (2), or (3) described above, one embodiment of the present invention is time-to-digital conversion circuitry in which the digital signals are a single digital signal, and has a rising edge that is the start time point and a falling edge that is the stop time point or has a falling edge that is the start time point and a rising edge that is the stop time point.

Advantageous Effects of Invention

According to one aspect of the present invention, it is possible to realize time-to-digital conversion circuitry that can suppress linearity deterioration due to variations in the delay characteristics of delay elements that constitute oscillation circuitry.

BRIEF DESCRIPTION OF DRAWINGS

FIG. 1 is a block diagram illustrating a conventional time-to-digital conversion circuitry.

FIG. 2 is a block diagram illustrating other conventional time-to-digital conversion circuitry.

FIG. 3 is a block diagram illustrating yet other conventional time-to-digital conversion circuitry.

DESCRIPTION OF EMBODIMENTS

One embodiment of the present invention will be described below in detail with reference to FIGS. 1 to 7.

Configuration of Time-to-Digital Conversion Circuitry 1

Figure 4:
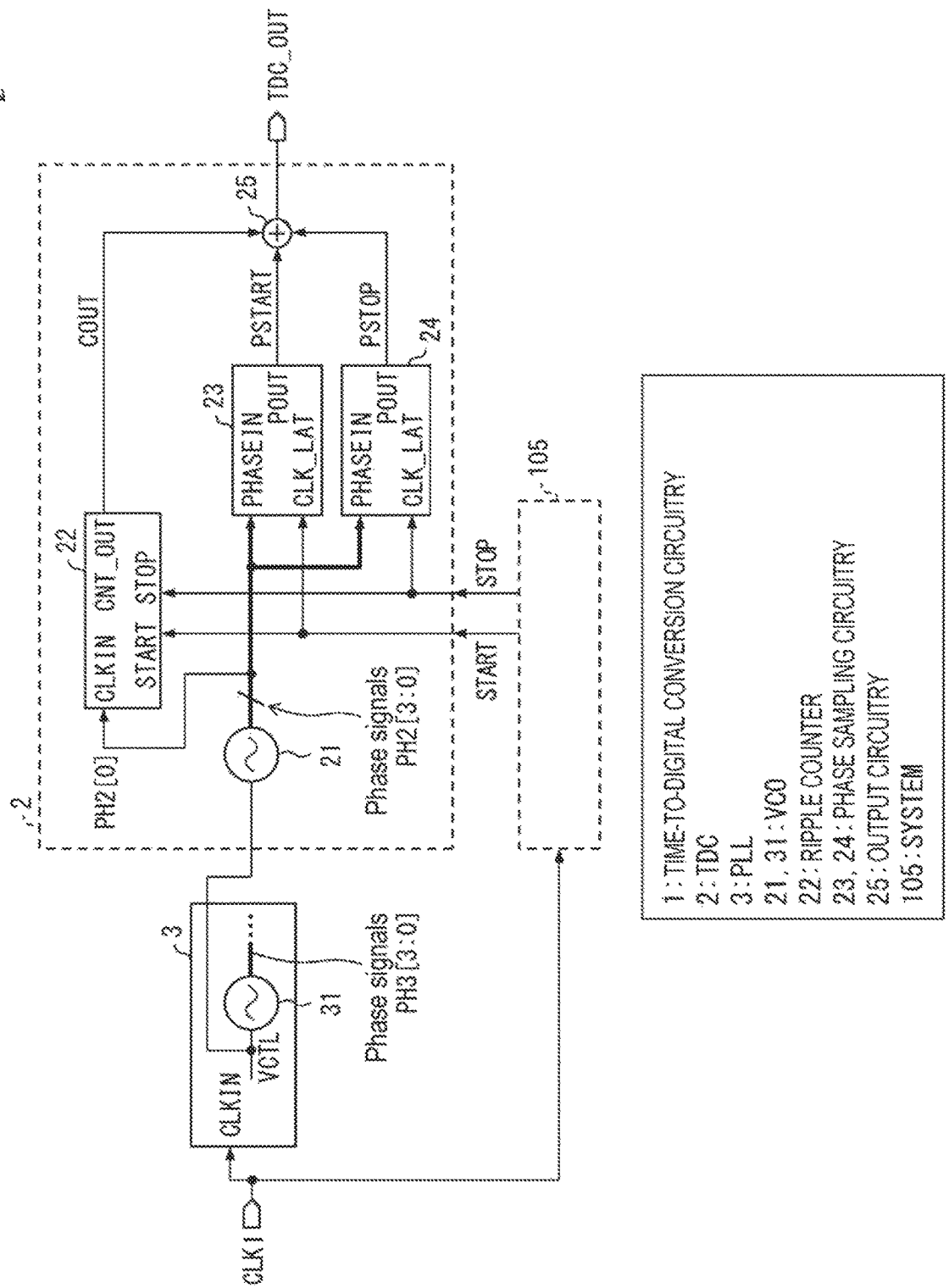
FIG. 4 is a block diagram illustrating time-to-digital conversion circuitry according to one embodiment of the present invention.

FIG. 4 is a block diagram illustrating time-to-digital conversion circuitry 1 according to the present embodiment.

As illustrated in FIG. 4, the time-to-digital conversion circuitry 1 comprises a TDC (Time-to-Digital Converter) 2 and a PLL (Phase-Locked Loop) 3.

A system 105 is a time observation target and creates two or more digital signals based on a reference clock CLK1. The system 105 outputs a start signal START (a first digital signal) whose logic level changes from low to high at a start time point, which is one state-change time point of the digital signals. On the other hand, the system 105 outputs a stop signal STOP (a second digital signal) whose logic level changes from low to high at a stop time point, which is another state-change time point of the digital signals.

In this case, the start signal START and the stop signal STOP are respective independent digital signals. However, a start time point and a stop time point may be provided for a single digital signal. In this digital signal, a rising edge may be the start time point, and a failing edge may be the stop signal STOP, or a falling edge may be the start time point, and a rising edge may be the stop signal STOP.

Also, the system 105 may output a start signal START whose logic level changes from high to low at the start time point and may also output a stop signal STOP whose logic level changes from high to low at the stop time point. That is, the falling edge of the start signal START is the start-time point, and the failing edge of the stop signal STOP is the stop time point.

The PLL 3 has a VCO (Voltage Controlled Oscillator) 31 (external oscillation circuitry). In the PLL 3, the oscillation frequency of the VCO 31 and the phases of phase signals output from the VCO 31 are feedback-controlled by a control voltage VCTL (voltage) or electrical current (not illustrated) so as to synchronize with the reference clock CLK1 supplied from outside. Also, the oscillation frequency of the VCO 31 is controlled to be a multiple or the like of the frequency of the clock CLK1. That is, the oscillation frequency of the VCO 31 can be controlled to be a prescribed value.

The TDC 2 is circuitry that, converts the time between the start signal START and the stop signal STOP, which are output from the system 105, into digital. This TDC 2 comprises a VCO 21 (oscillation circuitry), a ripple counter 22 (a counter), phase sampling circuitry 23 (first phase sampling circuitry), phase sampling circuitry 24 (second phase sampling circuitry), and output circuitry 25.

The VCO 21 has a configuration that is the same as the VCO 31 or a configuration that is similar to the VCO 31 and is controlled by a control voltage VCTL or electrical current that is the same as in the VCO 31.

The ripple counter 22 counts, as an input clock, the number of pulses of a particular phase, signal output from the VCO 21. Specifically, the ripple counter 22 starts the counting in synchronization with the start signal START and stops the counting in synchronization with the stop signal STOP to count the rising edges or the falling edges of the input clock. The ripple counter 22 outputs a count value COUT, which is a result of the counting, via a count terminal CNT_OUT.

In the ripple counter 22, the particular phase signal PH2[0] is input to a CLKIN terminal, the start signal START is input to a START terminal, and the stop signal STOP is input to a STOP terminal.

The phase sampling circuitry 23 samples a plurality of phase signals output from the VCO 21 in synchronization with the start signal START output from the system 105. The phase sampling circuitry 23 outputs a phase value, determined by logic values of the sampled phase signals, via an output terminal POUT as a detection phase PSTART.

The phase sampling circuitry 24 samples a plurality of phase signals output from the VCO 21 in synchronization with the stop signal STOP. The phase sampling circuitry 24 outputs a phase value, determined by logic values of the sampled phase signals, via the output terminal POUT as a detection phase PSTOP. The phase value is described later in detail.

In the phase sampling circuitry 23, 24, the plurality of phase signals is input to an input terminal PHASEIN, and the start signal START and the stop signal STOP are input to a latch terminal CLK_LAT.

Meanwhile, although the VCO 21 is disposed outside a feedback loop of the PLL 3, the VCO 21 is controlled with the same control voltage VCTL as in the VCO 31. Thus, the oscillation frequency of the VCO 21 is a value close to the oscillation frequency of the VCO 31. However, the phase of each phase signal from the VCO 21 is uncorrelated with, that is, asynchronous with the VCO 31 and the clock CLK1. That is, the VCO 21 performs free-running oscillation. Also, unlike the VCO 302 in the TDC 300 illustrated in FIG. 3, the VCO 21 continues to constantly oscillate interpedently of the start signal START and the stop signal STOP.

In the time-to-digital conversion circuitry 1, the PLL 3 is provided in order to suppress oscillation frequency variations due to variations in characteristics of transistors and so on that constitute the VCO 21 and in order to suppress variations that occur in the resolution of the TDC 2. The PLL 3 may also be omitted when there is no problem with variations in the frequency of the VCO 21 and the resolution of the TDC 2, or when such variations are corrected additionally. In the time-to-digital conversion circuitry 1 in which the PLL 3 is omitted, the control voltage VCTL may be applied to the VCO 21 through provision of DC voltage generating circuitry instead of the PLL 3.

The output circuitry 25 outputs an amount-of-delay measurement value TDC_OUT between the start signal START and the stop signal STOP, based on the count value COUT, the sampled value PSTART, and the sampled value PSTOP. More specifically, in accordance with equation (1) noted above, the output circuitry 25 adds a difference between the sampled value PSTOP and the sampled value PSTART to a value obtained by multiplying the count value COUT by a prescribed value.

In this case, it is assumed that the phase sampling circuitry 23, 24 samples 4-bit phase signals PH2 [3:0] output from the VCO 21 to thereby allow one cycle of the VCO 21 to be divided into eight phases, as described below. In the time-to-digital conversion circuitry 1, although the system 105 operates with the same clock as the clock CLK1, the above-described CSST is applicable. Accordingly, it is possible to avoid linearity deterioration of the TDC 2 which is caused by variations in the delay characteristics of delay elements that constitute the VCO 21.

Configuration of VCO 213

Figure 5:
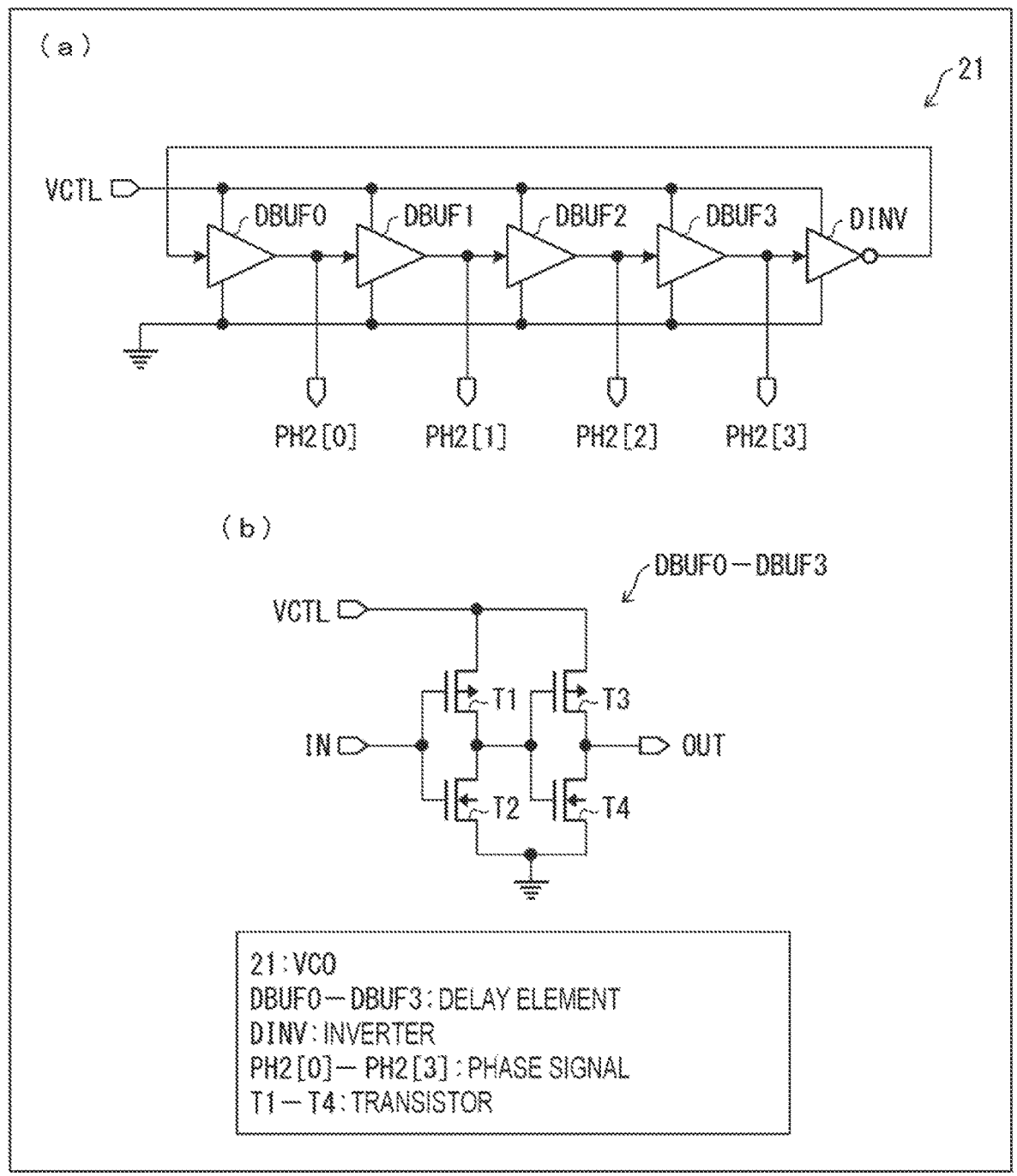
FIG. 5(a) is a circuitry diagram illustrating a VCO in the time-to-digital conversion circuitry, and (b) is a circuitry diagram illustrating the circuitry configuration of delay elements that constitute the VCO.

The configuration of the VCO 21 will be described, (a) in FIG. 5 is a circuitry diagram illustrating the VCO 21. (b) in FIG. 5 is a circuitry diagram illustrating the circuitry configuration of delay elements that constitute the VCO 21.

As illustrated in (a) in FIG. 5, the VCO 21 has a plurality of digital-type delay elements DBUF0 to DBUF3 and an inverter DINV. The delay elements DBUF0 to DBUF3 and the inverter DINV are connected in series. All of respective ground terminals of the delay elements DBUF0 to DBUF3 and the inverter DINV are connected to ground, and a control voltage VCTL is applied to respective power-supply terminals thereof.

Varying the control voltage VCTL, which is a power-supply voltage of the delay elements DBUF0 to DBUF3, can make the respective amounts of delay in the delay elements DBUF0 to DBUF3 variable. This can make the oscillation frequency of the VCO 21 variable.

The inverter DINV is disposed in order to invert an output, signal of the delay element DBUF3 and feed back the inverted output signal to an input of the delay element DBUF0 at the first stage. In this case, the amount of delay in the inverter DINV is assumed to be sufficiently small.

As illustrated in (b) in FIG. 5, an inverter constituted by transistors T1 and T2 and an inverter constituted by transistors T3 and T4 are connected in series to thereby constitute each of the delay elements DBUF0 to DBUF3.

Configuration of Phase Sampling Circuitry 23, 24

Figure 6:
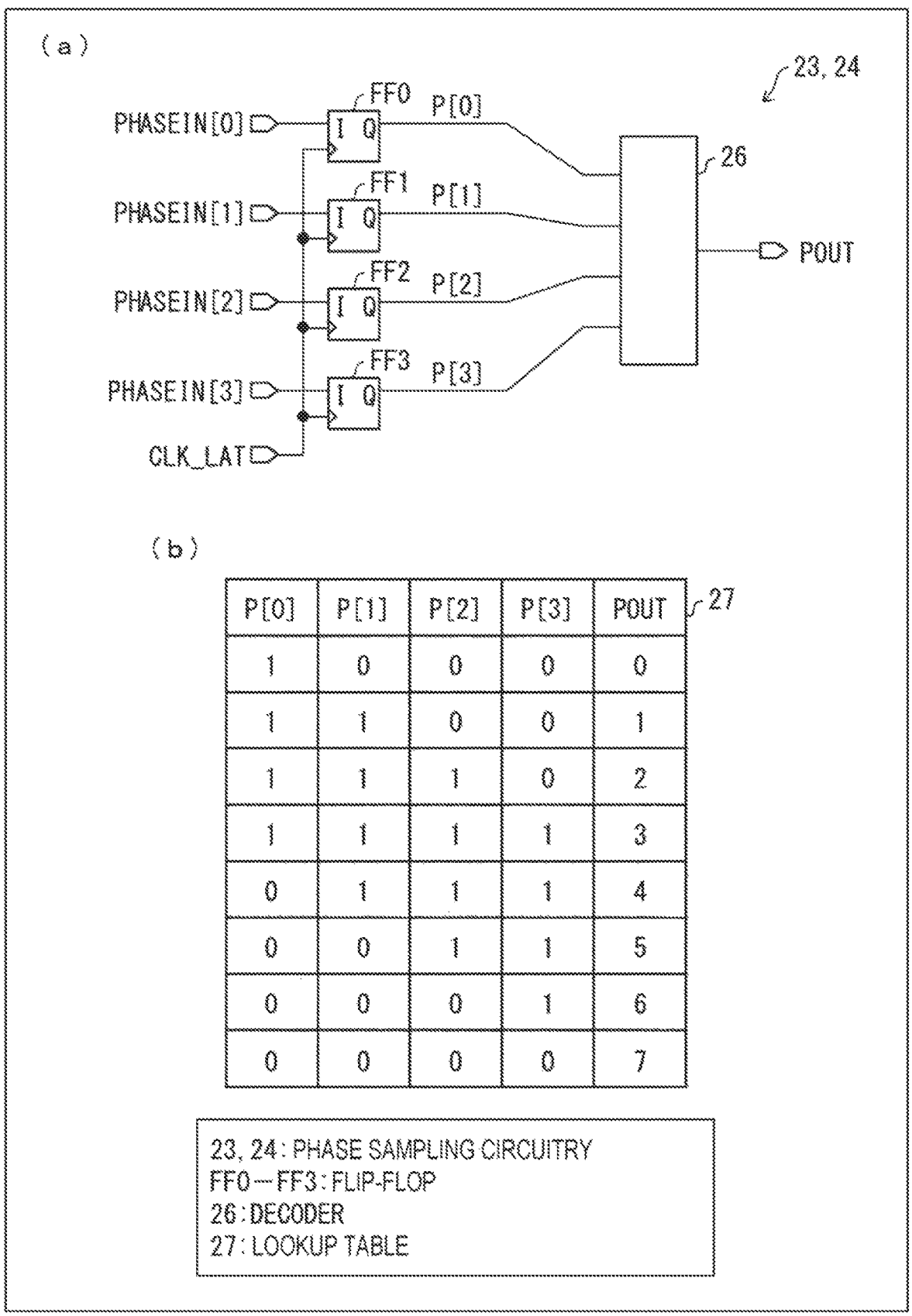
FIG. 6(a) is a circuitry diagram illustrating the circuitry configuration of phase sampling circuitry in the time-to-digital conversion circuitry, and (b) is a diagram illustrating a lookup table that is referred to during operation of a decoder in the phase sampling circuitry.

The phase sampling circuitry 23, 24 will be described, (a) in FIG. 6 is a circuitry diagram illustrating the circuitry configuration of the phase sampling circuitry 23, 24. (b) in FIG. 6 is a diagram illustrating a lookup table 27 that is referred to during operation of a decoder 26 in the phase sampling circuitry 23, 24.

As illustrated in (a) in FIG. 6, the phase sampling circuitry 23, 24 has a plurality of (in this case, four) delay-type flip-flops FF0 to FF3 and one decoder 26. The phase sampling circuitry 23, 24 has four input terminals PHASEIN [3:0] to which the 4-bit phase signals PH2 [3:0] from the VCO 21 are input and a latch terminal CLK_LAT to which the start signal START or the stop signal STOP from the system 105 is input.

The flip-flops FF0 to FF3 hold logic values of the phase signals PH2 [3:0] input to respective I terminals, in synchronization with the rising edge or the failing edge of the start signal START or the stop signal STOP, and outputs the logic values via Q terminals.

The decoder 26 decodes 4-bit values of output signals P [3:0] output from the respective Q terminals of the flip-flops FF0 to FF3, in accordance with the lookup table 27 illustrated in (b) in FIG. 6, and outputs any one of integer values 0 to 7.

Operation of Time-to-Digital Conversion Circuitry 1

Figure 7:
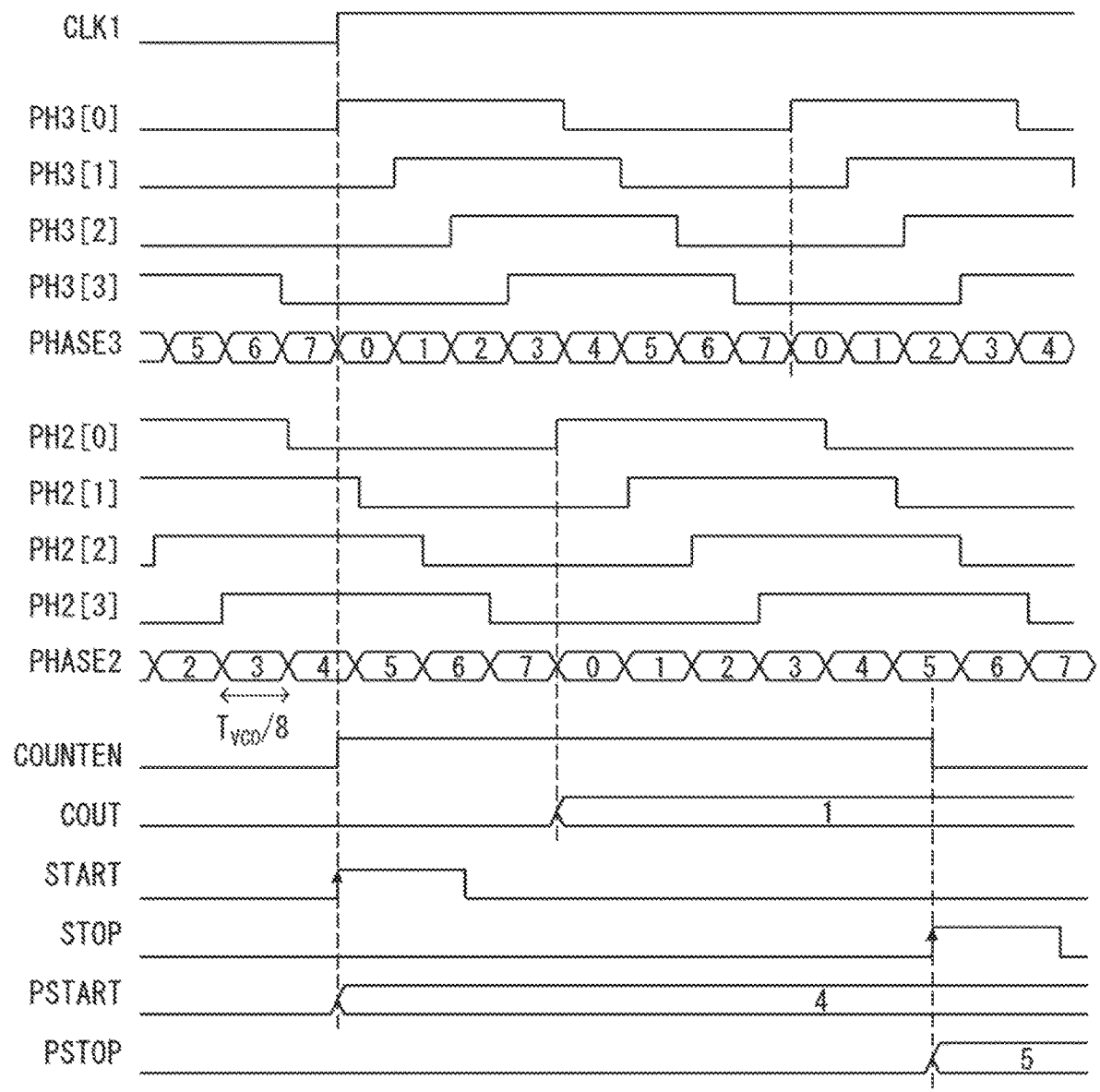
FIG. 7 is a timing chart illustrating the operation of the time-to-digital conversion circuitry.

The operation of the time-to-digital conversion circuitry 1 will be described. FIG. 7 is a timing chart illustrating the operation of the time-to-digital conversion circuitry 1.

As illustrated in FIG. 7, the VCO 31 outputs 4-bit phase signals PH3 [3:0]. Since the PLL 3 is controlled so that the phase signal PH3 [0] of the VCO 31 rises simultaneously with the clock CLK1, the rising edge of the clock CLK1 and the rising edge of the phase signal PH3 [0] synchronize with each other.

The VCO 31 causes delay elements to delay the signal of the phase signal PH3 [0] to thereby output the phase signals PH3 [3:1] other than the phase signal PH3 [0]. The VCO 21 is configured to be the same as the VCO 31 or has a configuration that is similar to the VCO 31. Accordingly, a phase value PHASE3 of the VCO 31 is defined as illustrated in FIG. 7, based on relationships between phase signals and phase values in the lookup table 27 illustrated in (b) in FIG. 6.

Meanwhile, the rising edges of the phase signals PH2 [3:0] of the VCO 21 are asynchronous with the rising edges of the clock CLK1 and the phase signal PH3 [0]. Thus, the rising edge of the phase signal PH2 [0] occurs at a random time point. The VCO 21 causes the delay elements DBUF0 to DBUF3 to delay the phase signal PH2 [0] to thereby output, each of the phase signals PH2 [3:1]. Based on the relationships between the phase signals and the phase values in the lookup table 27 illustrated in (b) in FIG. 6, a phase value PHASE2 of the VCO 21 is defined as illustrated in FIG. 7.

FIG. 7 illustrates a case in which one cycle of the phase signals PH2 [3:0] of the VCO 21 has a value close to one cycle of the phase signals PH3 [3:0] of the VCO 31 but has a slightly larger value. Owing to this slight frequency displacement, the phase of the phase signal PH2 [0] and the phase of the phase signal PH3 [0] are uncorrelated (asynchronous) with each other in the long-term view.

The logic level of a count enable signal COUNTED within the ripple counter 22 goes high in a period between the rising edge of the start signal START and the rising edge of the stop signal STOP. The ripple counter 22 counts the number of rising edges of the phase signal PH2 [0] in that period. FIG. 7 illustrates an example in which the number of rising edges of the phase signal PH2 [0] in the above-described period is one. In this case, a count value COUNT, which is an output of the ripple counter 22, changes from 0 to 1.

The phase sampling circuitry 23 samples respective logic values (0 or 1) of the phase signals PH2 [3:0] on the rising edge of the start signal START and outputs "4", which is a phase value PHASE2 determined by the logic values, as a detection phase PSTART (a first phase value). On the other hand, the phase sampling circuitry 24 samples respective logic values (0 or 1) of the phase signals PH2 [3:0] on the rising edge of the stop signal STOP and output "5", which is a phase value PHASE2 determined by the logic values, as a detection phase PSTOP (a second phase value).

In accordance with equation (1) noted above, the output circuitry 25 calculates the amount-of-delay measurement value TDC_OUT (an output digital value) between the start signal START and the stop signal STOP by performing the following calculation.

The time from the rising of the start signal START to time point at which the count value COUT changes from 0 to 1 is 8-PSTART=8-4=4LSB. Meanwhile, the time from a time point at which the count value COUT changes from 0 to 1 to the rising of the stop signal STOP is 8×(COUT-1)+PSTOP=8×0+5=5LSB. Accordingly, the amount-of-delay measurement value TDC_OUT is calculated as in the following equation.

$$TDC\_OUT = 8 - PSTART + 8 \times (COUT - 1) + PSTOP$$
$$= 8 \times COUT + (PSTOP - PSTART) = 9LSB$$

In the above equation, LSB (Least Significant Bit) means 1, which is a minimum resolution of the output digital value of the TDC 2. Accordingly, TDC_OUT described above can also be represented as 9LSB. Also, a time interval corresponding to 1LSB of the amount-of-delay measurement value TDC_OUT is represented by $\Delta T_{LSB}=T_{VCO}/8$ and represents the time interval of one section of the phase value PHASE2. Also, $T_{VCO}$ is the time of one cycle of the phase signals PH2 [3:0] of the VCO 21.

Thus, a time $\Delta T_{TDC\_OUT}$ from the rising edge of the start signal START to the rising edge of the stop signal STOP is represented by equation (2) below:

$$\Delta T_{TDC\_OUT}=9\Delta T_{LSB}=2(T_{VCO}/8) \tag{2}$$

As described above, the phase of the phase value PHASE2 becomes uncorrelated (asynchronous) with the phases of the start signal START and the stop signal STOP in the long view. Accordingly, even when there are variations in the time intervals of 0 to 7 that are the phase values PHASE2 of the respective phase signals PH2 [3:0], CSST can suppress linearity deterioration of the TDC 2 which is caused by the variations.

In general, a clock of a TDC is synchronous with a start signal START or a stop signal STOP. In the example illustrated in FIG. 7, the rising edge of the clock CLK1 and the rising edge of the start signal START are also synchronous with each other. In this example, since the phase value PHASE2 also becomes uncorrelated (asynchronous) with the start signal START and the stop signal STOP, as described above, the linearity of the TDC 2 does not deteriorate.

Advantages of Time-to-Digital Conversion Circuitry 1

As described above, the time-to-digital conversion circuitry 1 according to the present embodiment comprises the VCO 21, the ripple counter 22, the phase sampling circuitry 23, 24, and the output circuitry 25.

The VCO 21 is not phase-synchronous with other signals used in the time-to-digital conversion circuitry 1 and outputs a plurality of phase signals having mutually different phases.

The ripple counter 22 counts the number of pulses of any one of the plurality of phase signals PH2 [3:0] output from the VCO 21. The phase sampling circuitry 23 samples the phase signals PH2 [3:0] in synchronization with the start signal START output from the system 105 to be observed. The phase sampling circuitry 24 samples the phase signals PH2 [3:0] in synchronization with the stop signal STOP output from the system 105. The output circuitry 25 adds a difference between the sampled value PSTOP of the phase sampling circuitry 24 and the sampled value PSTART of the phase sampling circuitry 23 to a value obtained by multiplying the count value COUT of the ripple counter 22 by a prescribed value.

According to the above-described configuration, since the VCO 21 performs free-running oscillation, the phase of the start signal START and the phase of the stop signal STOP do not synchronize with the phase signals PH2 [3:0] output, by the VCO 21. This allows the clock CLK1, used as an operation clock in the time-to-digital conversion circuitry 1, to be shared with the system 105. Therefore, an asynchronous clock system that is independent from the time-to-digital conversion circuitry 1 does not need to be constructed for the system 105. Accordingly, a circuitry system related to clocks can be simplified. Hence, even when the phases of the start signal START and the stop signal STOP from the system 105 are synchronous with the phase of the clock CLK1, it is possible to suppress linearity deterioration due to variations in the delay characteristics of the delay elements DBUF0 to DBUF3 that, constitute the VCO 21.

Also, in the time-to-digital conversion circuitry 1, the VCO 21 constantly oscillates.

Thus, noise due to ON/OFF operation of the VCO 21 does not occur. Also, since the VCO 21 and the VCO 31 constantly oscillate, temperature changes in the VCO 21 and the VCO 31 are substantially the same, compared with a case in which the VCO 21 performs ON/OFF operation. Thus, the frequency characteristics of the VCO 21 follow the frequency characteristics of the VCO 31 to make it easy to stabilize the characteristics of the TDC 2 relative to a temperature. Furthermore, since it is not necessary to perform ON/OFF control on the VCO 21, it is possible to simplify the configuration of the delay elements DBUF0 to DBUF3 that, constitute the VCO 21. As a result, the oscillation frequency of the VCO 21 is easily set higher, that is, the temporal resolution of the TDC 2 can be easily improved.

Supplementary Information

The present invention is not limited to each embodiment described above, various changes are possible within the scope recited in the claims, and an embodiment obtained by appropriately combining the technical means respectively disclosed in the different embodiments is also encompassed by the technical scope of the present invention. In addition, new technical features can be formed by combining the technical means respectively disclosed in the embodiments.

REFERENCE SIGNS LIST 1 time-to-digital conversion circuitry
2 TDC
3 PLL
21 VCO (oscillation circuitry)
22 ripple counter (counter)
23 phase sampling circuitry (first phase sampling circuitry)
24 phase sampling circuitry (first phase sampling circuitry)

25 output circuitry
31 VCO (external oscillation circuitry)
CLK1 clock
PSTART detection phase (first phase value)
PSTOP detection phase (second phase value)
START start signal
STOP stop signal
TDC_OUT amount-of-delay measurement value

The invention claimed is:

1. Time-to-digital conversion circuitry that converts a time between a start time point and a stop time point, which are state-change time points of at least one digital signals, into digital, the time-to-digital conversion circuitry comprising:
   oscillation circuitry that outputs a plurality of phase signals having different phases;
   first phase sampling circuitry that outputs a first phase value determined by the plurality of phase signals sampled in synchronization with the start time point;
   second phase sampling circuitry that outputs a second phase value determined by the plurality of phase signals sampled in synchronization with the stop time point;
   a counter that counts the number of pulses of any one of the plurality of phase signals; and
   output circuitry that outputs a digital value of the time, based on a count value of the counter, the first phase value, and the second phase value,
   wherein the oscillation circuitry performs free-running oscillation and outputs the phase signals that do not synchronize with the start time point and the stop time point.

2. The time-to-digital conversion circuitry according to claim 1,
   wherein the oscillation circuitry constantly oscillates.

3. The time-to-digital conversion circuitry according to claim 1, further comprising:
   a phase synchronization loop including external oscillation circuitry having a configuration that is the same as or similar to the oscillation circuitry,
   wherein a voltage or electrical current for controlling an oscillation frequency or a phase of the external oscillation circuitry is also applied to the oscillation circuitry, and
   an oscillation frequency of the oscillation circuitry is controlled to have a value close to the oscillation frequency of the external oscillation circuitry.

4. The time-to-digital conversion circuitry according to claim 1,
   wherein the at least one digital signals include
   a start signal whose rising edge or falling edge is a start time point, and
   a stop signal whose falling edge or rising edge is a stop time point.

5. The time-to-digital conversion circuitry according to claim 1,
   wherein the at least one digital signals are a single digital signal, and
   has a rising edge that is the start time point and a falling edge that is the stop time point, or
   has a falling edge that is the start time point and a rising edge that is the stop time point.

* * * * *